United States Patent [19]

Kronberg

[11] Patent Number: 5,317,253

[45] Date of Patent: May 31, 1994

[54] CONCEALED WIRE TRACING APPARATUS

[75] Inventor: James W. Kronberg, Aiken, S.C.

[73] Assignee: The United States of America as represented by the United States Department of Energy, Washington, D.C.

[21] Appl. No.: 798,785

[22] Filed: Nov. 27, 1991

[51] Int. Cl.⁵ .......................................... G01R 19/00
[52] U.S. Cl. ...................................................... 324/67
[58] Field of Search ............................ 324/66, 67, 326

[56] References Cited

U.S. PATENT DOCUMENTS

| | | | |
|---|---|---|---|
| 658,013 | 9/1900 | Iddings et al. | 324/67 |
| 1,212,763 | 1/1917 | Gregory | 324/67 |
| 1,241,963 | 10/1917 | Grove | 324/67 |
| 2,600,857 | 6/1952 | De La Mater | 324/67 |
| 2,698,921 | 11/1955 | Wharton | 324/67 |
| 3,889,179 | 6/1975 | Cutler | 324/3 |
| 3,924,179 | 12/1975 | Dozier | 324/66 |
| 4,700,489 | 10/1987 | Vasile | 324/67 |
| 4,804,907 | 2/1989 | Pecukonis | 324/67 |
| 5,130,638 | 7/1992 | Furukawa | 324/67 |

Primary Examiner—Walter E. Snow
Attorney, Agent, or Firm—Brian R. Tumm; Harold M. Dixon; William R. Moser

[57] ABSTRACT

An apparatus and method that combines a signal generator and a passive signal receiver to detect and record the path of partially or completely concealed electrical wiring without disturbing the concealing surface. The signal generator applies a series of electrical pulses to the selected wiring of interest. The applied pulses create a magnetic field about the wiring that can be detected by a coil contained within the signal receiver. An audible output connected to the receiver and driven by the coil reflects the receiver's position with respect to the wiring. The receiver's audible signal is strongest when the receiver is directly above the wiring and the long axis of the receiver's coil is parallel to the wiring. A marking means is mounted on the receiver to mark the location of the wiring as the receiver is directed over the wiring's concealing surface. Numerous marks made on various locations of the concealing surface will trace the path of the wiring of interest.

6 Claims, 1 Drawing Sheet

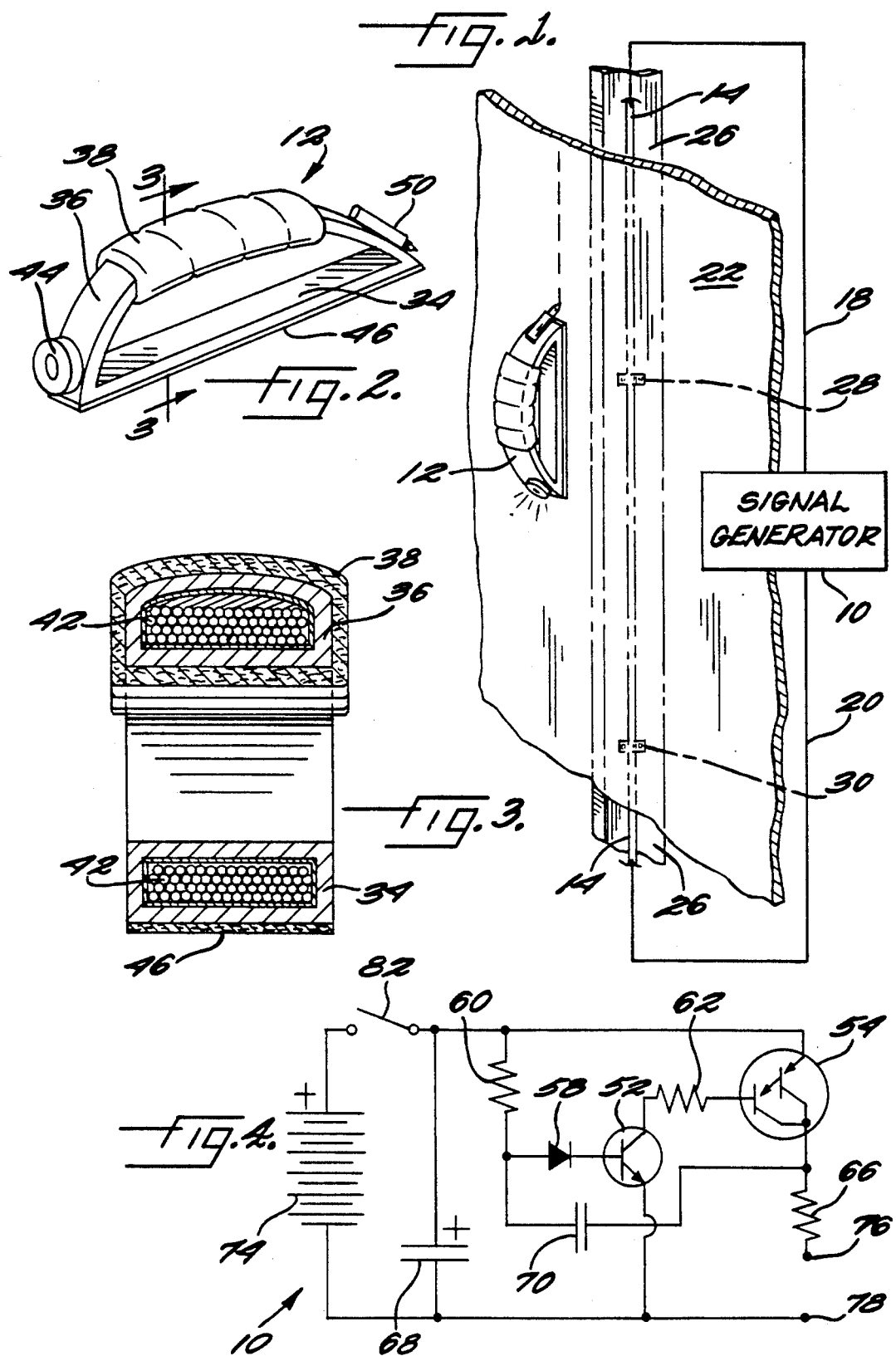

CONCEALED WIRE TRACING APPARATUS

The U.S. Government has rights in this invention pursuant to Contract No. DE-AC09-89SR18035 between the U.S. Department of Energy and Westinghouse Savannah River Company.

BACKGROUND OF THE INVENTION

1. Field of the Invention

The present invention relates to devices for detecting electrical wiring. More particularly, the present invention relates to devices for identifying and marking the location of electrical wiring that is partially or completely concealed.

2. Discussion of Background

The use of electrical transmitters and receivers for detecting hidden conductors is known. Grove, U.S. Pat. No. 1,241,963, and Iddings, et al. U.S. Pat. No. 658,013, disclose electrical means for locating concealed pipes. After energizing the pipe system of interest, an exploring coil connected to one or more receivers is surveyed along the area of interest. The coil provides audible notification when the coil passes directly over and along the length of the pipe.

U.S. Pat. No. 1,212,763, issued to Gregory, uses an induction device to produce a high frequency AC current through a concealed conductor. The detector consists of a cylindrical coil with a magnetic coil, connected to a telephone receiver. The receiver produces a distinct buzzing sound when the plane of the detector coincides with the conductor. The conductor can then be traced by moving the detector.

Although numerous devices exist for detecting hidden conductors, there is a need for a more convenient and thorough detection method. Such a method would use a device that is compact, inexpensive, portable, simple to use, accurate, and foolproof. There is also a need for a reliable method of marking or recording the path of the detected conductors.

SUMMARY OF THE INVENTION

According to its major aspects and broadly stated, the present invention is an apparatus and method for the selective detection and identification of electrical conductors. In particular, it is the combination of a signal transmitter and receiver for detecting and recording the path of partially or completely concealed electrical wiring without having to disturb the concealing surface. The present invention uses an electrical pulse generator in conjunction with a signal receiving device. The pulse generator applies a series of electrical pulses to the selected wiring. The applied pulses create a magnetic field about the wiring that can be detected by a sensing coil contained within the signal receiving device. An audible output connected to the signal receiver and driven by the sensing coil reflects the signal receive's position with respect to the wiring with an audible response. The response is strongest when the receiver is directly above the wiring and the long axis of the signal receive's sensing coil is parallel to the wiring. A marking means is mounted on the signal receiver to periodically mark the location of the wiring as the signal receiver is directed over the wiring's concealing surface.

A major feature of the present invention is the unique mounting of the marking means on the signal receiver. The advantage of this feature is that it allows the detected portions of the wiring to be marked on the concealing surface, thus eventually forming a marked path displaying the location of the conducting wire of interest. The particular mounting position of the marking means on the handle of the signal receiver allows the exact location of the wiring to be marked simply by tilting the signal receiver forward once it is in an ideal position. The function and convenience provided by the marking is not known to exist in previous detection devices of this kind.

Another feature of the present invention is the abrasion-resistant surface of the signal receiver. The flat surface area of the signal receiver that comes in contact with the wiring's concealing surface when the signal receiver is being used is covered with an abrasion-resistant material such as Nylon. This feature facilitates smooth and non-abrading movement of the signal receiver over the concealing surface. The non-resistant surface covering also functions to prolong the life of the signal receiver.

Other features and advantages of the present invention will be apparent to those skilled in the art from a careful reading of the Detailed Description of a Preferred Embodiment presented below and accompanied by the drawings.

BRIEF DESCRIPTION OF THE DRAWINGS

In the drawings,

FIG. 1 is a perspective view of a wire detecting apparatus according to a preferred embodiment of the present invention;

FIG. 2 is a detailed view of a signal receiver according to a preferred embodiment of the present invention;

FIG. 3 is a partial cross-sectional view of the signal receiver taken along lines 3—3 of FIG. 2;

FIG. 4 is a schematic of a pulsed signal generator according to a preferred embodiment of the present invention.

DETAILED DESCRIPTION OF A PREFERRED EMBODIMENT

Referring now to FIG. 1, the invention preferably consists of two components: a pulse signal generator 10, and a signal receiver 12. Pulse signal generator 10 is preferably connected to an electrically conducting wire 14 of interest by a pair of connecting assemblies 18 and 20. Connecting assemblies 18, 20 can be affixed to the ends of wiring 14 by a pair of alligator clips (not shown). Very often, electrical wiring 14 will be installed behind a concealing surface 22, such as a wall, and along a stud 26 by some means of attachment such as brackets 28 and 30.

Signal receiver 12, as shown in detail in FIGS. 2 and 3, consists of a flat planar surface 34 connected at each end to a curved, stirrup-shaped handle 36. A resilient material, such as flexible polyurethane foam, is molded around handle 36 to provide a grip 38. The interior portion of planar surface 34 and handle 36 is occupied with a continuously wound sensing coil 42, preferably consisting of several hundred turns of fine-gauge, enameled magnet wire. The ends of sensing coil 42 are connected to the input terminals of an audible output means 44, which is mounted to the exterior surface of handle 36, near one end or the other. Audible output means 44, preferably a piezoelectric transducer, is capable of producing an audible response in air. Planar surface 34 is covered with an abrasion-resistant material 46, such as Nylon, that prolongs the overall life and contributes to the convenience of signal receiver 12.

A recording means 50, preferably a cylindrical writing or marking instrument, is mounted to the exterior surface of handle 36, near the end that is opposite audible output means 44. Recording means 50 is mounted in a location where it can engage the surface being surveyed (such as concealing surface wall 22 in FIG. 1) by simply tilting signal receiver 12 slightly upward and forward.

FIG. 4 details the preferred embodiment of pulse signal generator 10. Pulse signal generator 10 is made up of transistors 52 and 54, diode 58, resistors 60, 62, and 66, capacitors 68 and 70, DC power source 74, and output terminals 76 and 78.

Preferably, transistor 52 is an NPN, small-signal type such as a 2N2222. Transistor 54 is a PNP power type, capable of switching several amperes, and preferably a Darlington combination such as a 2N6668. Diode 58 is a common small-signal type such as a 1N914, and is used only if transistor 52 is likely to be damaged by reverse biasing of the base-emitter junction, otherwise a direct connection is satisfactory.

Resistor 60 is preferably a quarter-watt device in the range of 100,000 ohms. Resistor 62 protects transistor 54 from damage by current surges and is in the range of 1000 ohms. Resistor 66 passes current to the conductor to be traced and is in the range of 1 ohm, preferably with a power rating of several watts.

Capacitor 68 is electrolytic, preferably a low-inductive, coiled aluminum foil type, with a rating of at least 100 microfarads and a working voltage equal to or exceeding the maximum power supply voltage. Capacitor 70 may be any nonpolarized type, such as plastic film or ceramic, with a rating in the range of 0.1 microfarad.

Power source 74 may consist of a battery, as shown, or of some other type of DC supply, such as a plug-in AC-powered converter. If AC-powered, it should provide the highest possible degree of electrical isolation between inputs and outputs. Power supply 74 should be capable of providing a working voltage in the range between six and thirty volts, and a continuous current in the range of 1 ampere. Switch 82 can be any common type, such as a miniature toggle switch, capable of handling the maximum current delivered by supply 74.

Preferably, the components used for pulse signal generator 10 are enclosed in a compact, rugged, and nonconductive housing (not shown). Switch 82, and terminals 76 and 78 are preferably mounted so as to extend outward from the housing, thereby being accessible to a user.

Using the schematic as shown in FIG. 4 and described above with component values within the range as previously described, pulse signal generator will produce a series of nearly square pulses at about 2000 Hertz, with each pulse being approximately 5 microseconds in duration and having a peak current of approximately 2 amperes. Coupled through a magnetic field to receiver 12, these characteristics allow efficient energy transfer to audible output means 44.

In use, terminal 76 of signal generator 10 is connected to one end of wire 14 and terminal 78 of signal generator 10 is connected to the other end of wire 14. Switch 82 of signal generator 10 is then closed, thereby allowing a pulsed electrical signal generated by signal generator 10 to pass through wire 14. Signal receiver 12 is then used to detect the location of wire 14 concealed by concealing surface 22. Flat surface 34 of signal receiver 12 is pressed against or held close to concealing surface 22. Signal receiver 12 is moved about concealing surface 22 based on the intensity of the sound produced by audible output means 44. Audible output means 44 directs the user's movement of signal receiver 12 about concealing surface 22 closer to a location just above wire 14 and with the long axis of receiver 12 parallel to wire 14. When planar surface 34 of signal receiver 12 is known by the user to be directly over and parallel to a portion of wire 14, signal receiver 12 is tilted slightly forward, allowing marking means 50 to engage concealing surface 22, thus marking on concealing surface 22 the location of wire 14. This movement and marking process is repeated as many times as desired by the user, preferably until a partial or complete path of the location of wire 14 is produced.

It will be apparent to those skilled in the art that many changes and substitutions can be made to the preferred embodiment herein described without departing from the spirit and scope of the present invention as defined by the appended claims.

What is claimed is:

1. An apparatus for detecting the presence of an electrical conductor, said conductor partially or completely concealed by a surface, said apparatus comprising:

a housing having a planar surface and a handle;

a coil of wire, said coil having a long axis and a short axis, said coil held by said housing so that said long axis is parallel to said planar surface, said coil being perpendicular to said planar surface;

means for generating an electrical signal in said electrical conductor;

a piezoelectric transducer in electrical connection with said coil so that, when said housing is moved toward said electrical conductor and said signal generating means is generating a signal in said electrical conductor, said piezoelectric transducer emits a signal having an intensity related to the distance and orientation of said coil with respect to said electrical conductor, said signal of said piezoelectric transducer indicating by a highest relative intensity when said planar surface engages said concealing surface, said coil is closest to said electrical conductor and said long axis is parallel thereto; and means for marking said concealing surface, said marking means carried by said housing so that said marking means marks said concealing surface when said housing is tilted.

2. The apparatus as recited in claim 1, wherein said planar surface is covered with an abrasion-resistant material.

3. The apparatus as recited in claim 1, wherein said signal generating means generates approximately square pulses at a frequency of approximately 2000 Hertz.

4. An apparatus for detecting the presence of an electrical conductor, said conductor partially or completely concealed by a surface, said apparatus comprising:

a housing having an interior, a planar surface and a handle;

a coil of wire carried by said housing, said coil having a long axis and a short axis, said coil wound through said interior so that said long axis is parallel to said planar surface, said coil being perpendicular to said planar surface;

means for generating nearly square electrical pulses in said electrical conductor;

a piezoelectric transducer in electrical connection with said coil so that, when said housing is moved toward said electrical conductor and said signal generating means is generating a signal in said electrical conductor, said piezoelectric transducer emits a signal having an intensity related to the distance and orientation of said coil with respect to said electrical conductor, said signal of said piezoelectric transducer indicating by a highest relative intensity when said planar surface engages said concealing surface, said coil is closest to said electrical conductor and said long axis is parallel thereto; and means for marking said concealing surface, said marking means carried by said housing and marking said concealing surface by tilting said housing.

5. The apparatus as recited in claim 4, wherein said planar surface is covered with an abrasion-resistant material.

6. The apparatus as recited in claim 4, wherein said signal generating means generates square pulses at a frequency of approximately 2000 Hertz.

* * * * *